United States Patent
Dewit et al.

(10) Patent No.: US 7,321,100 B2
(45) Date of Patent: Jan. 22, 2008

(54) HOUSING FOR HIGH-SPEED ELECTRO-OPTICAL ASSEMBLY INCORPORATING LATCHING AND EMI SHIELDING

(75) Inventors: John Gerard Dewit, Scotts Valley, CA (US); Jignesh Shah, Sunnyvale, CA (US); Ashok Parmar, Fremont, CA (US)

(73) Assignee: Beam Express Inc, Sunnyvale, CA (US)

( * ) Notice: Subject to any disclaimer, the term of this patent is extended or adjusted under 35 U.S.C. 154(b) by 0 days.

(21) Appl. No.: 11/332,626

(22) Filed: Jan. 13, 2006

(65) Prior Publication Data
US 2007/0163803 A1 Jul. 19, 2007

(51) Int. Cl.
*H05K 9/00* (2006.01)

(52) U.S. Cl. ............... 174/382; 174/377; 361/722; 361/759; 361/754; 361/818; 361/800; 361/798; 361/801

(58) Field of Classification Search ........... 174/372, 174/50, 350, 351, 359, 363, 377, 382; 439/73, 439/159, 352; 361/801, 704, 756, 728, 797, 361/798, 800, 816, 818, 722, 754, 759
See application file for complete search history.

(56) References Cited

U.S. PATENT DOCUMENTS

| | | | | |
|---|---|---|---|---|
| 5,694,298 | A * | 12/1997 | Chabert et al. | 361/798 |
| 6,250,553 | B1 * | 6/2001 | Beseth et al. | 235/487 |
| 6,545,611 | B2 * | 4/2003 | Hayashi et al. | 340/686.4 |
| 2004/0207988 | A1 * | 10/2004 | Branch et al. | 361/728 |

* cited by examiner

*Primary Examiner*—Hung V. Ngo
(74) *Attorney, Agent, or Firm*—Amin, Turocy & Calvin, LLP

(57) ABSTRACT

A system and method for placing an electro-optical assembly inside a panel. In accordance with various embodiments of the invention, the system includes a housing to house the electro-optical assembly. The housing comprises a top section, a bottom section, a front element, an attachment module, and a metallic plate. A latching unlatching mechanism facilitates removal of the hosing from the panel. The electro-optical assembly provides EMI shielding.

17 Claims, 4 Drawing Sheets

HOUSING FOR HIGH-SPEED ELECTRO-OPTICAL ASSEMBLY INCORPORATING LATCHING AND EMI SHIELDING

BACKGROUND

The present invention relates to a housing for an electro-optical assembly. More specifically, these embodiments relate to a housing for a high-speed electro-optical assembly, incorporating latching and Electro-Magnetic Interference (EMI) shielding.

Housings to place various circuit assemblies are used in a number of industries and applications. These housings need to be placed inside a panel and removed from it. A latching mechanism is used to enable easy installation and removal of the housings from the panel. One such housing, which uses a latching mechanism, can be plugged into the panel. Such a housing is commonly known as plug-in housing or plug-in module. The plug-in module houses the circuit assembly.

Generally, the latching mechanisms are made of plastic. However, they frequently break due to continued use.

Furthermore, in order to conveniently release the plug-in module from the panel, a method is required for the easy removal of the plug-in module and the electro-optical assembly from the panel.

An increase in the density of circuitry has resulted in circuit assemblies of high density, which need to be arranged compactly, without increasing the size of the housing. An increase in the size of the housing results in the requirement for larger panels that can accommodate the housing. In addition, an increase in the circuit density implies a corresponding increase in the amount of heat dissipated by the circuit elements.

Electrical circuits are susceptible to interference due to external electro-magnetic (EM) radiation. High speed electro-optical circuits emanate high-speed data signals and associated harmonics which may cause interference to other circuits. These data signals, unless they are contained within the housing, can result in EM interference from their external EM radiation. This phenomenon is commonly known as EMI. Therefore, there is a requirement for a housing that can contain the data signals and associated harmonics within and minimize any interference from the external EM radiations.

In view of the foregoing, and other problems in the art, not specifically listed herein, a housing with a compact and a reliable latching mechanism is required. The latching mechanism should enable easy installation in, and removal from, the panel. In addition, there is a requirement for a housing that can dissipate heat generated by a high-density circuit assembly.

SUMMARY

An object of the invention is to provide a system for placing an electro-optical assembly.

Another object of the invention is to provide a system for placing a housing of electro-optical assembly, inside a panel.

The above-mentioned objects are achieved by a system for containing the electro-optical assembly inside the panel, and a system for placing the electro-optical assembly within the panel. In accordance with an embodiment of the invention, the system comprises a housing to house the electro-optical assembly. The housing comprises a top section, a bottom section, a front element, an attachment module, and a metallic plate. The top and bottom sections are designed to provide effective thermal management for the electro-optical assembly and its components. The front element, in combination with the metallic plate, minimizes the leakage of electro-magnetic (EM) radiations, so as to prevent EM Interference (EMI) of the housing to the outside equipment and reduces the EM interference from outside sources. The attachment module enables the latching of the housing within a panel as well as an easy removal of the housing from the panel, with the help of an unlatching mechanism.

DETAILED DESCRIPTION

The embodiments of the present invention relate to placing an electro-optical assembly inside a housing, which is plugged into a panel by means of a latching and unlatching mechanism. The housing shields the electro-optical assembly from Electro-Magnetic Interference (EMI). It also includes a plurality of heat conduits, which provide a heat path to cool the electro-optical assembly.

Figure 1:
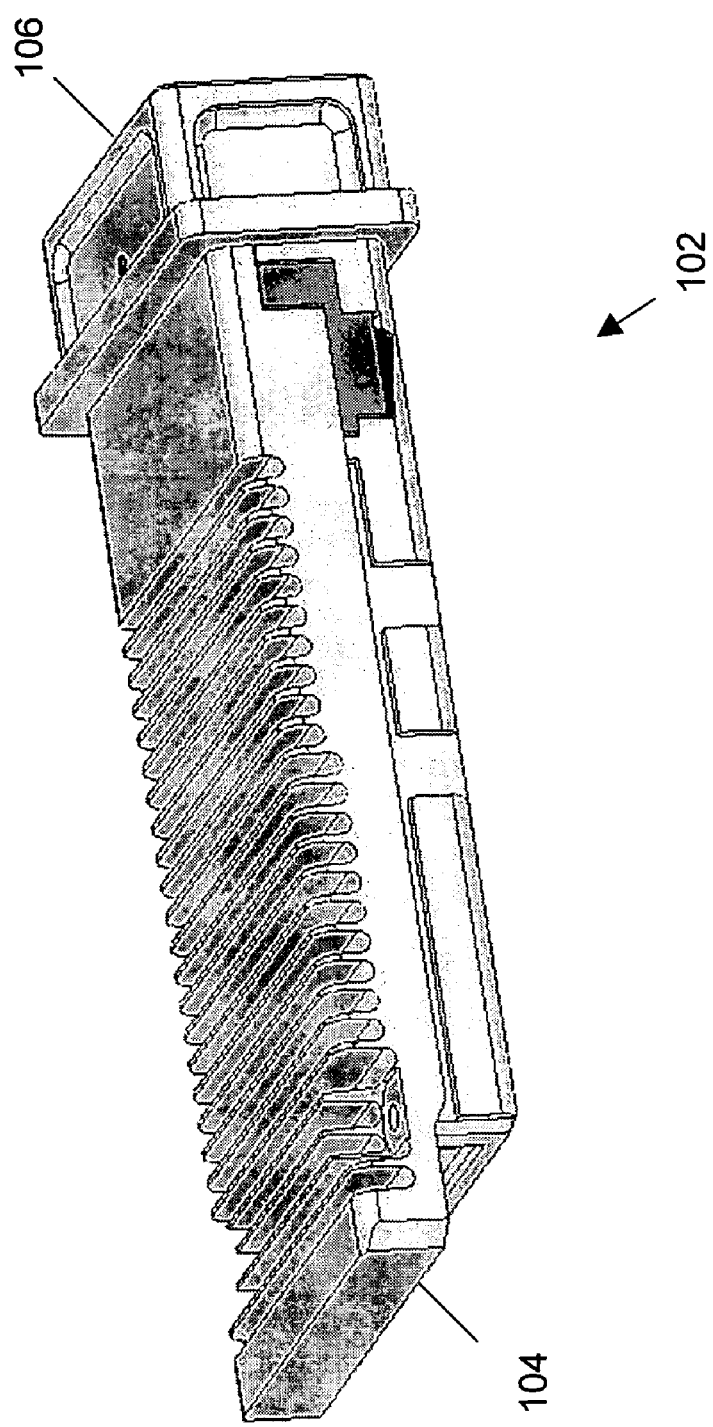
FIG. 1 illustrates a housing for holding an electro-optical assembly, in accordance with an exemplary embodiment of the present invention.

FIG. 1 illustrates a housing for holding an electro-optical assembly, in accordance with an exemplary embodiment of the present invention. Although the embodiments of the invention have been described with reference to electro-optical circuit assemblies, it is not limited thereto. The embodiments of the invention will also apply to other circuits, such as electrical circuits. A housing 102 is an enclosed housing that holds the electro-optical assembly. In an exemplary embodiment, housing 102 is a metallic clamshell, which is plugged into a panel. The panel can be a device that holds an array of housings, wherein the housings interact with each other as well as one or more external circuits. A left side 104 of housing 102 is inserted into the panel and remains inside the panel. A right side 106 is accessible to a user for the purpose of latching and/or unlatching housing 102 by accessing right side 106.

Figure 2:
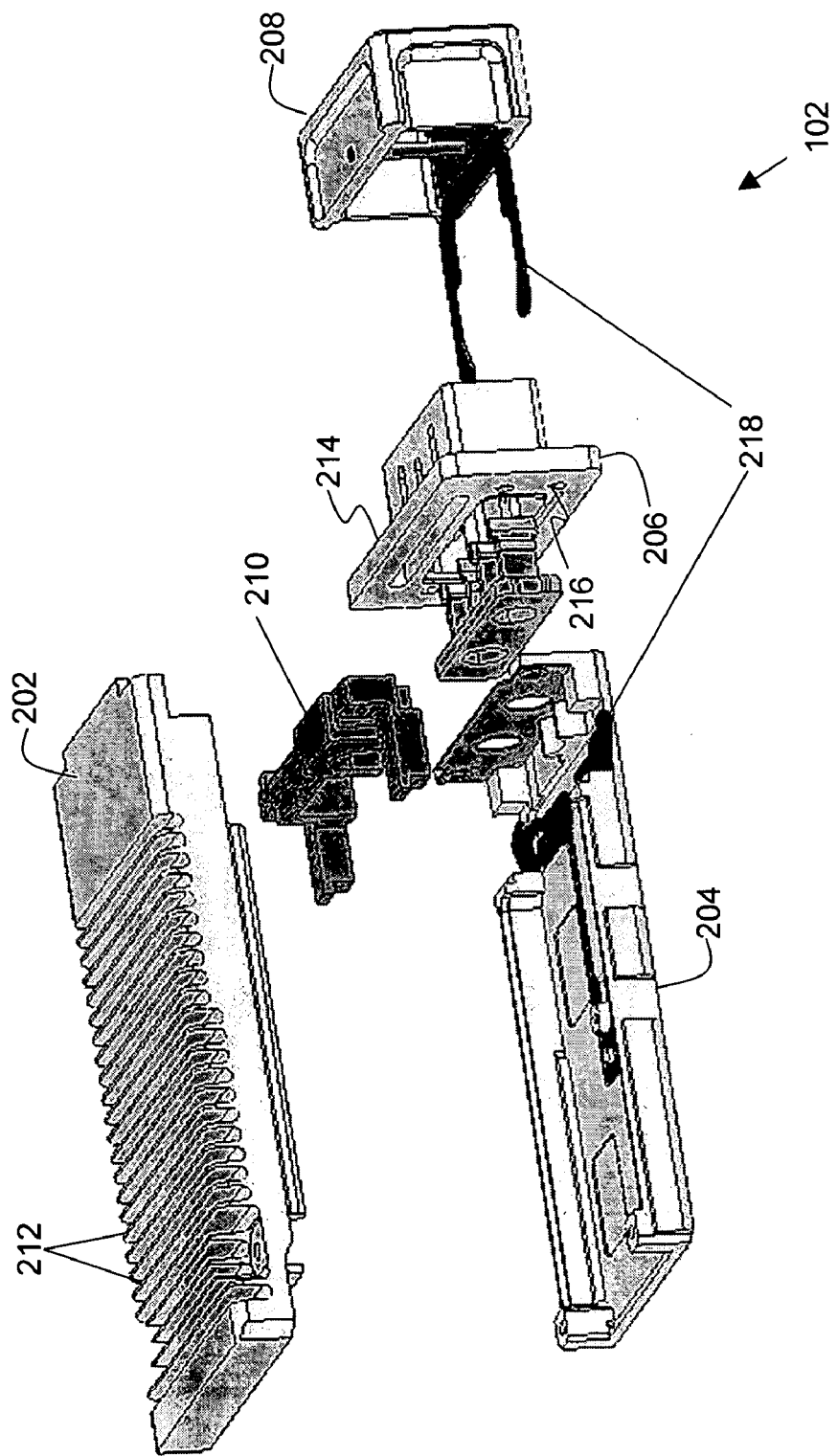
FIG. 2 is an exploded view of the housing, in accordance with an exemplary embodiment of the present invention.

FIG. 2 is an exploded view of housing 102, in accordance with an exemplary embodiment of the present invention. Housing 102 includes a top section 202, a bottom section 204, a front element 206, a handle 208, and retainer 210. The electro-optical assembly is placed between top section 202 and bottom section 204. Top section 202 includes a number of thermal conduits 212. According to an exemplary embodiment, thermal conduits 212 can be an array of narrow fins on the surface of top section 202. Thermal conduits 212 provide a heat path to cool the internal components of the electro-optical assembly in top section 202 and bottom section 204 of housing 102. The electro-optical assembly is connected to a communication link, which passes through front element 206 to connect with the electro-optical assembly inside housing 102. The communication link can be any of: a fiber-optic cable, a co-axial cable, a twisted pair cable, a power cable, an insulated cable or a shielded cable. Front element 206 includes a first face 214 and a second face 216. Handle 208 surrounds first face 214 and can be accessed by the user to either install or remove housing 102 from the panel. The user pushes handle 208 to install housing 102 in the panel, and pulls it to remove housing 102. Further, handle 208 is connected to an attachment module 218, which enables the attachment and detachment of housing 102 from the panel when the user either installs or removes it.

According to the various embodiments of the invention, the components of attachment module 218 are similar in shape. The components of attachment module 218 can be made from aluminium, copper, a metallic alloy, a composite material of high tensile strength, and the like.

Handle 208 is pushed to latch housing 102 in the panel. Handle 208 is pulled to unlatch housing 102 from the panel. As described in the subsequent FIGS. 5a and 5b, the panel includes a cut out, and guides or rails may be provided internal to the panel to hold housing 102. Retainer 210 facilitates the passage of the communication link through housing 102. It also ensures that the functioning of the electro-optical assembly is not affected by EMI.

Figure 3:
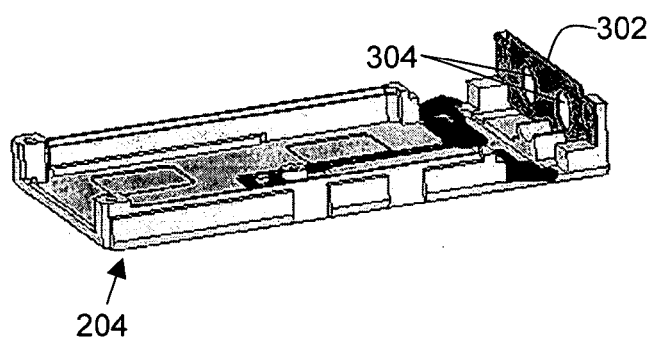
FIG. 3 illustrates a metallic plate for the Electro-Magnetic Interference (EMI) integrity of the housing, in accordance with an exemplary embodiment of the present invention.

FIG. 3 illustrates a metallic plate 302 mounted to bottom section 204 of housing 102 for the Electro Magnetic Interference (EMI) integrity of the housing, in accordance with an exemplary embodiment of the invention. The vulnerable area for EM leakage is the front portion of front element 206. The leakage of EM radiations is responsible for the EMI. Metallic plate 302, placed adjacent to front element 206, enables EMI shielding. According to an exemplary embodiment of the invention, metallic plate 302 is made of an EMI-resistant metal. For example, the metal includes, but is not limited to, steel, aluminium, copper, etc. Furthermore, metallic plate 302 allows the passage of the communication links, leaving and entering through front element 206. This passage is enabled through holes 304 in metallic plate 302. Holes 304 are the largest openings for EM radiation leakage. According to an embodiment, the diameter of the communication links is the same as the diameter of holes 304. This minimizes any leakage from housing 102.

Figure 4:
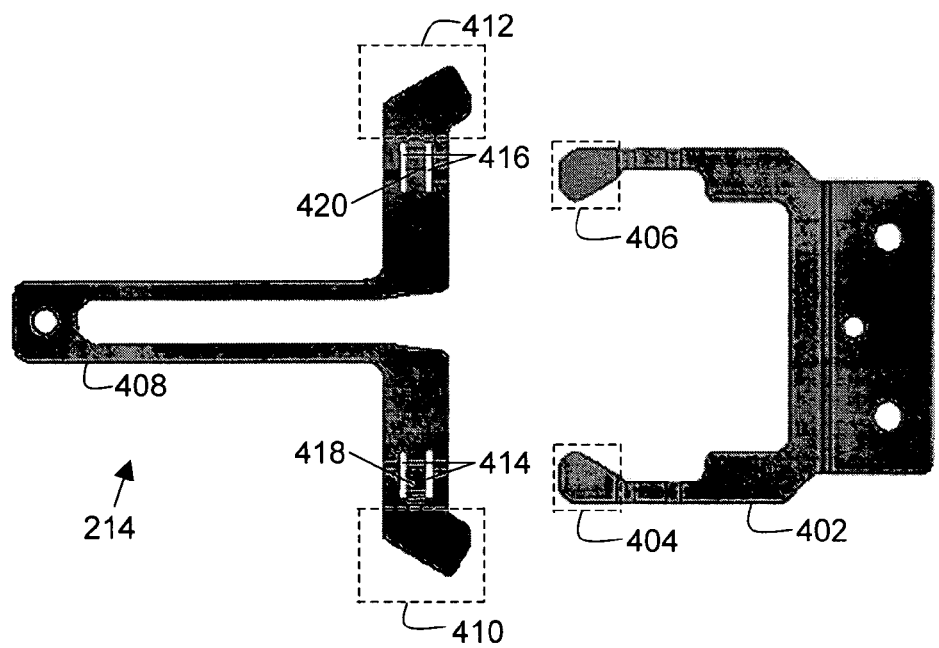
FIG. 4 illustrates a split tee hairpin spring and a fork element, in accordance with an exemplary embodiment of the present invention.

FIG. 4 illustrates a fork element 402 and a split-tee-hairpin spring 408, in accordance with an exemplary embodiment of the invention. Fork element 402 and split-tee-hairpin spring 408 enable the user to install and/or remove housing 102 from the panel. Housing 102 is installed by a latching action and removed by an unlatching action. These actions are explained in detail in the subsequent paragraphs.

Fork element 402 includes a first angular end 404 and a second angular end 406. First and second angular ends 404 and 406 inter-engage with split-tee-hairpin spring 408. Fork element 402 is connected with handle 208. When handle 208 is pulled or pushed in any direction, fork element 402 is also pulled or pushed accordingly. Split-tee-hairpin spring 408 is attached to bottom section 204. According to an exemplary embodiment, split-tee-hairpin spring 408 can be attached to bottom section 204 of housing 102 with a rivet. Split-tee-hairpin spring 408 consists of a first latch point 410, a second latch point 412, a first pair of slits 414, a second pair of slits 416, a first upstanding element 418, and a second upstanding element 420. First and second latch points 410 and 412 extend from housing 102, i.e., protrude from housing 102, to enable them to hold housing 102 inside the panel. First and second latch points 410 and 412 latch housing 102 to the panel when the user pushes handle 208. Split-tee-hairpin spring 408 has a 'spring action'. As a result of the spring action, first and second latch points 410 and 412 can be compressed in an inward direction. This is illustrated further through FIG. 5a. Split-tee-hairpin spring 408 is connected to handle 208 with an inter-engagement with fork element 402. An integrated view of split-tee-hairpin spring 408 and fork element 402 is illustrated subsequently in FIGS. 5a and 5b. First and second pair of slits 414 and 416 function as the openings for first and second angular ends 404 and 406, respectively. First and second angular ends 404 and 406 pass through the openings provided by first pair of slits 414, and second pair of slits 416 and, inter-engage fork element 402 with split-tee-hairpin spring 408. There exists a relative motion between fork element 402 and split-tee-hairpin spring 408. First and second upstanding elements 418 and 420 facilitate the relative motion of first and second angular ends 404 and 406, through the openings provided by first and second pair of slits 414 and 416, respectively.

According to the various embodiments of the invention, the distance between the narrowest elements of first and second angular ends 404 and 406 is less than the respective distances between the first and second pair of slits 414 and 416. Therefore, after the application of an initial push, first and second angular ends 404 and 406 get locked within the openings provided by first and second pair of slits 414 and 416, respectively. The initial push is provided while assembling attachment module 218 and the installation of element 402 in the base is aided by a compression of the split hairpin spring element 408. After the application of the initial push, first and second angular elements 404 and 406 remain locked with split-tee-hairpin spring 408. The fork element 402 will not pull out from the split hairpin spring once the housing is fully assembled due to limited travel within the fully assembled housing.

Figure 5A:
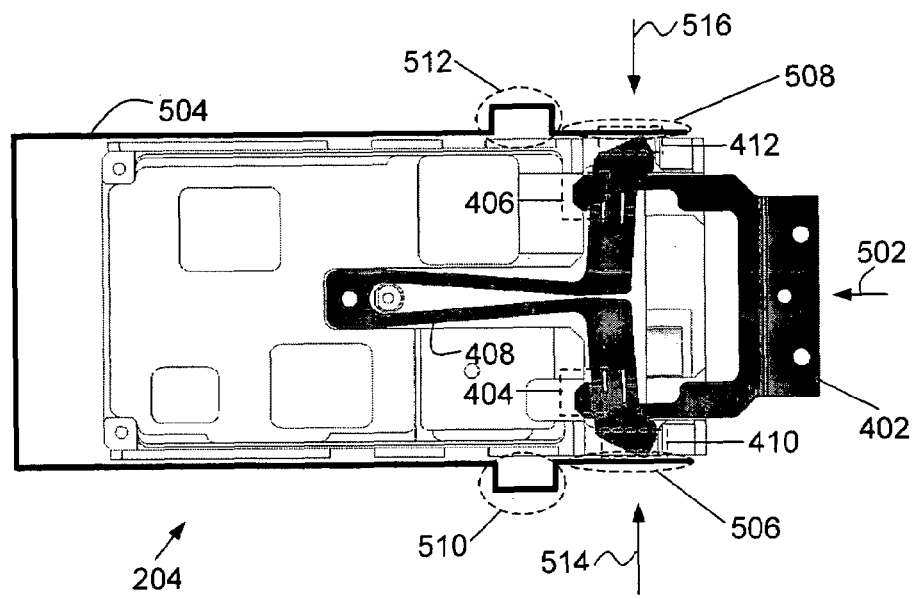
FIG. 5a illustrates an intermediate state of an electro-optical assembly during the latching or, unlatching of the assembly with the panel, in accordance with an exemplary embodiment of the present invention.

FIG. 5a illustrates an intermediate state of electro-optical assembly during the latching or unlatching of housing 102 with the panel, in accordance with an exemplary embodiment of the invention. During the latching, handle 208 is pushed along a direction 502, in order to install housing 102 inside a guide 504 located in the panel in which housing 194 is to be mounted. Guide 504 includes a first rail 506, a second rail 508, a first recess 510 and a second recess 512. When handle 208 is pushed along direction 502, fork element 402 is also pushed in direction 502. First and second rails 506 and 508 provide a restraining passage, for first and second latch points 410 and 412. During the pushing of housing 102 in direction 502, first and second latch points 410 and 412 compress in directions 514 and 516, respectively. This is due to the restraint provided by first and second rails 506 and 508, and due to the spring action of split-tee-hairpin spring 408. Subsequently, as soon as the compressed first and second latch points 410 and 412 make a contact with first and second recesses 510 and 512, first and second latch points 410 and 412 de-compress, and extend into first and second recesses 510 and 512. Both compression and de-compression of first and second latch points 410 and 412 is aided by the spring action of split-tee-hairpin spring 408. Consequently, housing 102 is latched inside guide 504. According to various embodiments of the invention, there remains a clearance between housing 102, and first and second rails 506 and 508. This clearance is less than the extent of protrusion of first and second latch points 410 and 412 from housing 102.

Figure 5B:
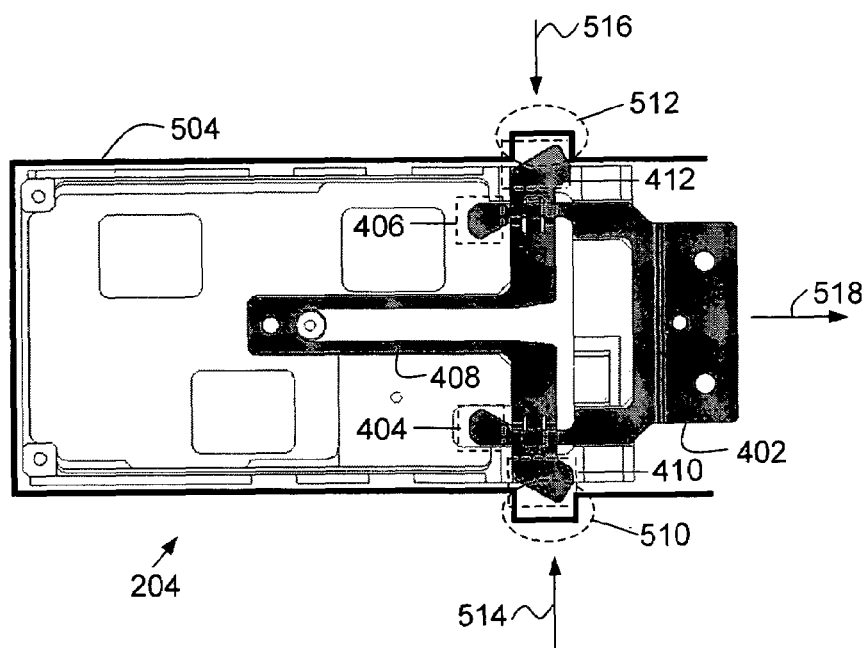
FIG. 5b illustrates an electro-optical assembly, in a latched state, inside the panel, in accordance with an exemplary embodiment of the present invention.

FIG. 5b illustrates the electro-optical assembly, in a latched state, inside the panel, in accordance with an exemplary embodiment of the invention. In order to unlatch and remove housing 102 from the panel, handle 208 is pulled along a direction 518. During the process of pulling, fork element 402 also gets pulled along direction 518. Subsequently, first and second angular ends 404 and 406 also get pulled along direction 518. As explained earlier, fork element 402 is inter-engaged with split-tee-hairpin spring 408 due to the passage of first and second angular ends 404 and 406 through a pair of slits 414 and 416, respectively. Therefore, when first and second angular ends 404 and 406 are pulled along direction 518, it causes the relative motion between fork element 402, and split-tee-hairpin spring 408. The movement of first and second angular ends 404 and angular end 406 along direction 518 translates into a movement of first and second latch points 410 and 412 along direction 514 and 516, respectively. This movement is due to the spring action of split-tee-hairpin spring 408. Therefore, the translation from the linear movement of first and second angular ends 404 and 406, to perpendicular movement of first and second latch points 410 and 412 in directions 514 and 516 respectively, is initiated by the pulling of handle 208. Consequently, first and second latch points 410 and 412 are compressed in directions 514 and 516, respectively, and are retracted into housing 102. Whereupon, housing 102 is unlatched from guide 504 of the panel. Once unlatched, housing 102 can be slid out of the panel. The movement of fork element 402 in direction 518 is restricted to a movement that is enough to fully retract latching elements 410 and 412. Further application of force in direction 518, results in removal of the entire housing element 102 from the panel.

While the preferred embodiments of the invention have been illustrated and described, it will be clear that it is not limited to these embodiments only. Numerous modifications, changes, variations, substitutions and equivalents will be apparent to those skilled in the art, without departing from the spirit and scope of the invention, as described in the claims.

What is claimed is:

1. A system for containing an electro-optical assembly, the system being placed inside a panel, the system comprising:
   a. a housing, the electro-optical assembly being placed in the housing, the housing including:
      i. a top section; and
      ii. a bottom section;
   b. a front element, the front element connected to the housing, the front element guiding at least one communication link for accessing the electro-optical assembly, the front element including:
      i. a first face; and
      ii. a second face;
   c. an attachment module, the attachment module connected to the front element of the housing, the attachment module mounting the housing within the panel, the attachment module including:
      i. a split tee hairpin spring, the split tee hairpin spring comprising compressible latch points, wherein the latch points compress on insertion of the housing inside the panel to facilitate latching of the housing within the panel; and
      ii. a fork element, wherein the fork element inter-engages with the split tee hairpin spring to facilitate unlatching of the housing from the panel; and
   d. a metallic plate, the metallic plate comprising at least one hole to pass the at least one communication link passing through the front element to the electro-optical assembly, the metallic plate being attached to the second face of the front element.

2. The system according to claim 1, wherein the housing is a metallic clamshell.

3. The system according to claim 1, wherein the housing shields electro magnetic interference.

4. The system according to claim 1, wherein the top section comprises a plurality of heat conduits.

5. The system according to claim 1, wherein the bottom section comprises a plurality of heat conduits.

6. The system according to claim 1, wherein the latch points protrude from the housing.

7. The system according to claim 6, wherein the split tee hairpin spring comprises two pairs of slits, the two pairs of slits inter-engaging with the fork element.

8. The system according to claim 1, wherein the fork element comprises angular ends.

9. The system according to claim 6, wherein the split tee hairpin spring is placed at the bottom section of the housing.

10. The system according to claim 1, wherein the system further comprises a handle, the handle surrounding the first face of the front element, the handle being connected to the attachment module, the handle being pushed to latch the system with the panel, the handle being pulled to unlatch the system from the panel.

11. The system according to claim 1, wherein the communication link is selected from the group consisting of a fiber optic cable, a coaxial cable, and a twisted pair cable.

12. A system for placing an electro-optical assembly, the system being placed inside a panel, the system comprising:
   a. a housing, the electro-optical assembly being placed in the housing, the housing including:
      i. a top section; and
      ii. a bottom section;
   b. a front element, the front element connected to the housing, the front element guiding at least one communication link for accessing the electro-optical assembly, the front element including:
      i. a first face; and
      ii a second face;
   c. a handle, the handle surrounding the first face of the front element, the handle being pushed to latch the system, the handle being pulled to unlatch the system;
   d. a latching mechanism, the latching mechanism latching the system to the panel; and
   e. an unlatching mechanism interengaging with the latching mechanism, the unlatching mechanism permitting the unlatching of the system from the panel, the unlatching mechanism comprises a fork element, the fork element being attached to the handle, the fork element comprising a pair of angular ends, each of the pair of angular ends inter-engaging with the latching mechanism.

13. The system according to claim 12, wherein the front element further comprises a metallic plate, the metallic plate being attached to the second face of the front element, the metallic plate having at least one hole to allow the passage of the at least one communication link.

14. The system according to claim 12, wherein the latching mechanism and the unlatching mechanism are interengaged with each other, the interengagement resulting in a relative motion between the latching mechanism and the unlatching mechanism.

15. The system according to claim 14, wherein the latching mechanism comprises a split tee hairpin spring, the split tee hairpin spring being attached to bottom section of the housing, the split tee hairpin spring comprising:
   a. latch points, the latch points protruding from the housing;
   b. two pairs of slits, the pairs of slits being an opening for the inter-engagement between the latching mechanism and the unlatching mechanism; and
   c. two upstanding elements, each of the two upstanding elements being between each of the pairs of slits, the upstanding element facilitating the inter-engagement between the latching mechanism and the unlatching mechanism.

16. The system according to claim 15, wherein the latch points lock the housing within the panel.

17. The system according to claim 14, further comprising a plurality of heat conduits to cool the electro-optical assembly.

* * * * *